(12) United States Patent
Harlev et al.

(10) Patent No.: US 8,395,372 B2
(45) Date of Patent: Mar. 12, 2013

(54) METHOD FOR MEASURING CURRENT IN AN ELECTRIC POWER DISTRIBUTION SYSTEM

(75) Inventors: Joseph Yossi Harlev, Trophy Club, TX (US); Rhad Veazey, Paradise, TX (US); Leonard Johnson, Leander, TX (US); Theodore Konetski, Azle, TX (US)

(73) Assignee: Optisense Network, LLC, Grapevine, TX (US)

( * ) Notice: Subject to any disclaimer, the term of this patent is extended or adjusted under 35 U.S.C. 154(b) by 155 days.

(21) Appl. No.: 12/612,894

(22) Filed: Nov. 5, 2009

(65) Prior Publication Data

US 2011/0095750 A1    Apr. 28, 2011

Related U.S. Application Data

(63) Continuation-in-part of application No. 12/607,954, filed on Oct. 28, 2009, now Pat. No. 8,076,925.

(51) Int. Cl.
*G01R 31/00* (2006.01)
(52) U.S. Cl. ....... 324/96; 324/127; 324/142; 324/117 R; 250/227.17; 250/225; 385/12
(58) Field of Classification Search .............. 250/227.17
See application file for complete search history.

(56) References Cited

U.S. PATENT DOCUMENTS

| | | | |
|---|---|---|---|
| 2,709,800 A | 5/1955 | Temple et al. | |
| 3,324,393 A * | 6/1967 | Casey et al. | 324/96 |
| 4,216,503 A | 8/1980 | Wiggins | |
| 4,590,505 A | 5/1986 | Bluzer | |
| 4,635,055 A | 1/1987 | Fernandes et al. | |
| 4,683,421 A * | 7/1987 | Miller et al. | 324/96 |
| 4,758,962 A | 7/1988 | Fernandes et al. | |
| 4,797,607 A * | 1/1989 | Dupraz | 324/96 |
| 4,799,005 A | 1/1989 | Fernandes et al. | |
| 4,829,298 A * | 5/1989 | Fernandes | 340/870.27 |
| 4,869,254 A | 9/1989 | Stone | |
| 4,947,107 A * | 8/1990 | Doerfler et al. | 324/96 |
| 4,999,571 A * | 3/1991 | Ishiko et al. | 324/96 |
| 5,029,101 A | 7/1991 | Fernandes et al. | |
| 5,114,228 A | 5/1992 | Greenfield et al. | |
| 5,486,754 A * | 1/1996 | Cruden et al. | 324/96 |

(Continued)

OTHER PUBLICATIONS

Authors: Slobodan Petricevic, Slatan Stojkovic and Jovan B. Radunovic; Title: Development of a Portable Fiber-Optic Current Senso for Power Systems Monitoring; Publication: IEEE Transactions on Instrumentation and Measurement, vol. 53 No. 1, Feb. 2004.

(Continued)

*Primary Examiner* — Richard Isla Rodas
(74) *Attorney, Agent, or Firm* — Eric Karich; L. Lee Humphries

(57) ABSTRACT

A method of measuring a current of a current carrying cable teaches the first step of providing an optical sensor assembly comprising a base unit, and an optical current sensor mounted on the base unit for transmitting a beam of polarized electromagnetic radiation to an optical fiber. A light detector is also provided having a first channel that operably connecting the light detector to an analog to digital converter through a programmable gain amplifier, a second channel that operably connects the light detector directly to the analog to digital converter, and a processor operably connected to the analog to digital converter. The optical sensor assembly is mounted adjacent the current carrying cable, and the fiber optic is operably connected to a light detector. A plurality of factors are then evaluated from rotation information from the light detector, by using the first and second channels for analog to digital conversion operably connected with the processor.

29 Claims, 7 Drawing Sheets

U.S. PATENT DOCUMENTS

| | | | |
|---|---|---|---|
| 5,731,579 | A | 3/1998 | Woods |
| 5,892,357 | A | 4/1999 | Woods et al. |
| 5,939,711 | A | 8/1999 | Crawford et al. |
| 5,952,819 | A * | 9/1999 | Berkcan et al. ............ 324/117 R |
| 5,963,026 | A * | 10/1999 | Bosselmann et al. ........... 324/96 |
| 6,072,366 | A | 6/2000 | Maeda et al. |
| 6,124,706 | A | 9/2000 | Woods et al. |
| 6,166,816 | A | 12/2000 | Blake |
| 6,307,666 | B1 | 10/2001 | Davidson et al. |
| 6,362,615 | B1 | 3/2002 | Davidson et al. |
| 6,388,434 | B1 | 5/2002 | Davidson et al. |
| 6,462,327 | B1 | 10/2002 | Ezell |
| 6,580,553 | B2 * | 6/2003 | Kim et al. ................ 359/341.41 |
| 6,630,819 | B2 | 10/2003 | Lanagan et al. |
| 6,753,913 | B1 | 6/2004 | Bilhan |
| 6,844,799 | B2 | 1/2005 | Attarian et al. |
| 7,068,025 | B2 | 6/2006 | Bjorn |
| 7,129,693 | B2 | 10/2006 | Yakymyshyn et al. |
| 7,164,263 | B2 | 1/2007 | Yakymyshyn et al. |
| 7,199,571 | B2 | 4/2007 | Johnson et al. |
| 7,646,192 | B2 * | 1/2010 | Bjorn .............................. 324/96 |
| 7,777,605 | B2 * | 8/2010 | Zumoto et al. ................ 336/178 |
| 7,837,807 | B2 * | 11/2010 | Yoshizawa .................... 148/312 |
| 2007/0205750 | A1 * | 9/2007 | Yakymyshyn et al. ....... 324/127 |

OTHER PUBLICATIONS

Authors: Slobodan Petricevic, Slatan Stojkovic and Jovan B. Radunovi; Title: Practical Application of Fiber-Optic Current Sensor in Power System Harmonic Measurement, vol. 55, No. 3, Jun. 2006. www.fieldmetrics.net.

* cited by examiner

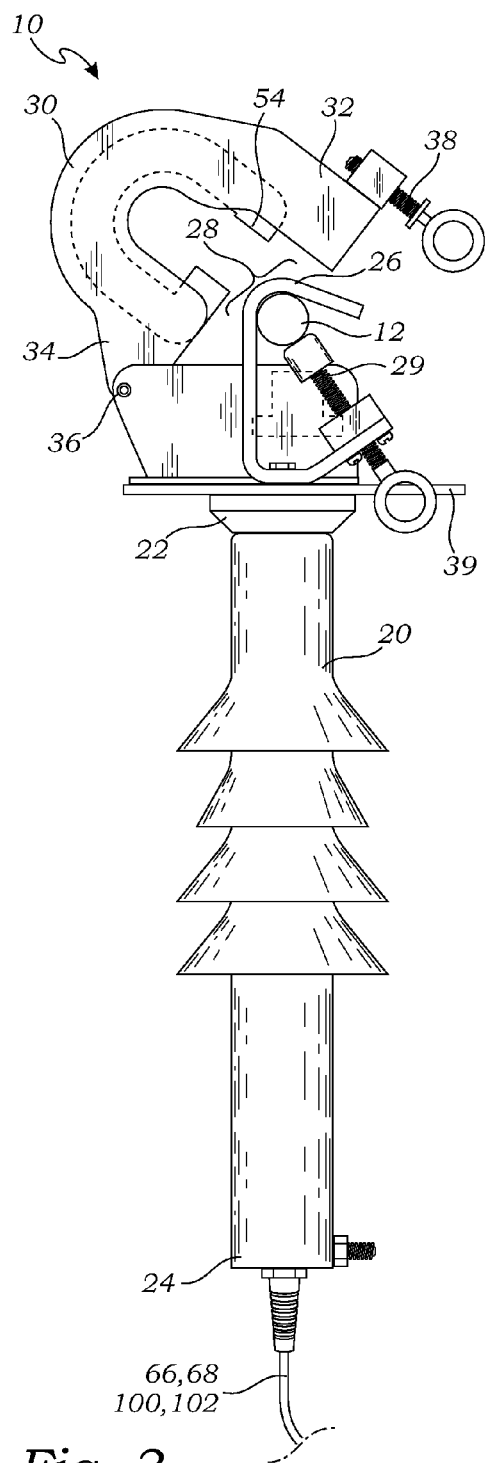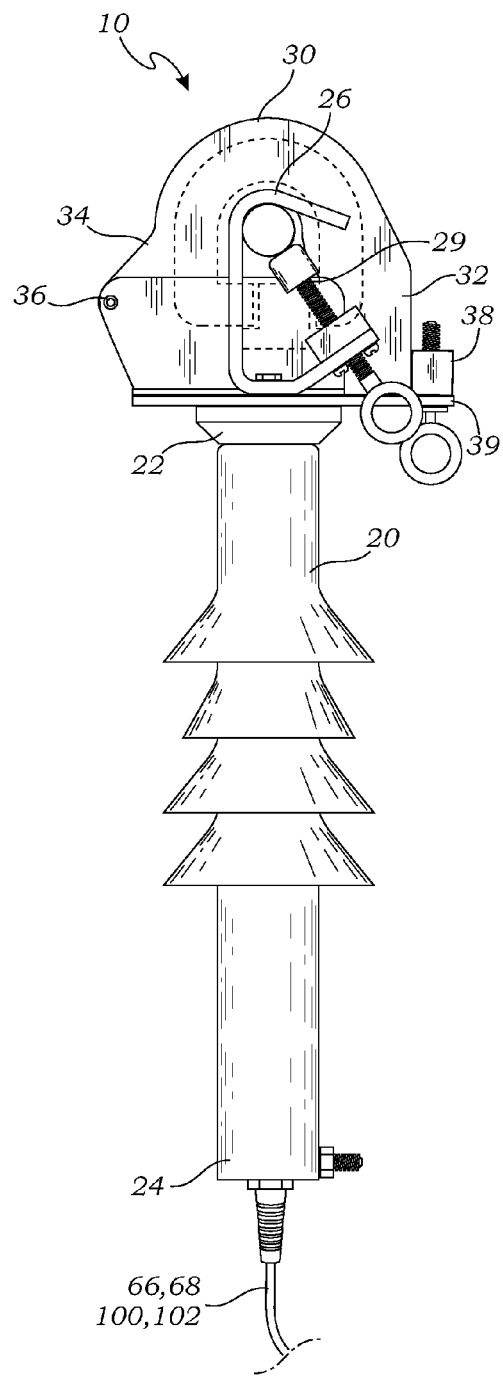
Fig. 3
Fig. 4

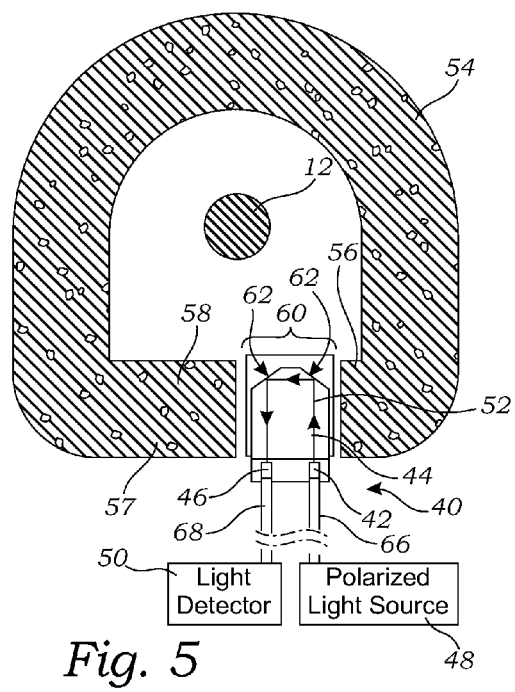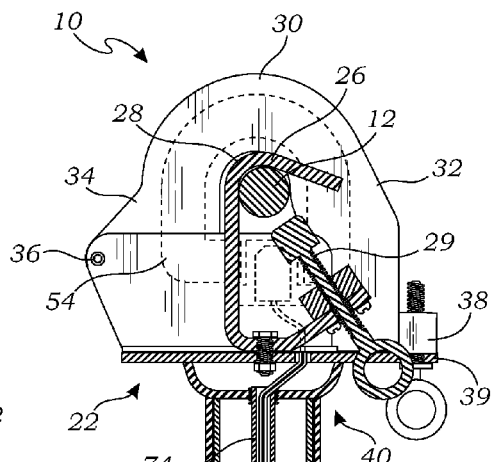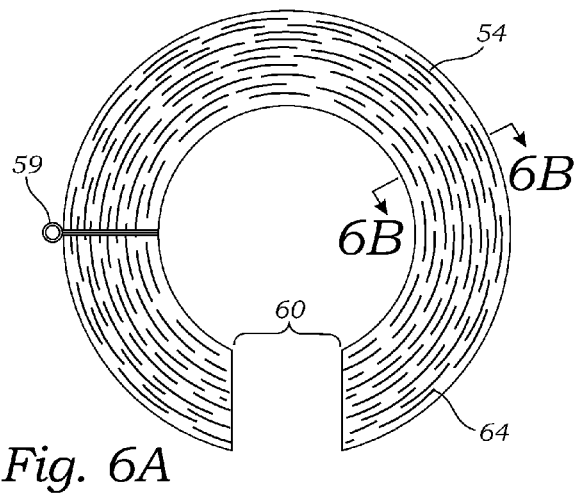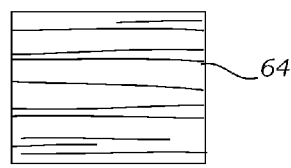

METHOD FOR MEASURING CURRENT IN AN ELECTRIC POWER DISTRIBUTION SYSTEM

CROSS-REFERENCE TO RELATED APPLICATIONS

This application for a utility patent is a continuation-in-part of a previously filed utility patent, having the application Ser. No. 12/607,954, filed Oct. 28, 2009 now U.S. Pat. No. 8,076,925.

STATEMENT REGARDING FEDERALLY SPONSORED RESEARCH

Not Applicable

BACKGROUND OF THE INVENTION

1. Field of the Invention

This invention relates generally to a method for measuring current, and more particularly to a method for sensing both current and voltage levels in a current carrying cable of an electric power distribution system.

2. Description of Related Art

A variety of sensors have been developed for measuring the current in a current carrying cable, such as that of a high voltage electricity distribution system. Optical current sensors based on the Faraday effect are known in the art. Optical current sensors that use bulk glass or fiber optic cable that surround the current carrying cable have very high dynamic range but require opening the current carrying cable at installation, hence are expensive.

Optical current sensors utilizing a magnetic concentrator with bulk optics in an airgap are also known in the art. One such embodiment is discussed in an article titled 'Use of Dual Frequency Excitation Method to Improve the Accuracy of an Optical Current Sensor,' by Shuping Wang, et al, SPIE meeting, August, 2009. The airgap stabilizes the temperature sensitivity of the magnetic material, as discussed in the publication 'Gapped Magnetic Core Structures,' by Gunter B. Finke, Magnetic Metals Corporation, Camden, N.J. 08101.

However, due to saturation, the magnetic concentrator may limit the dynamic range. An electric utility has various requirements for the dynamic range of the current sensors, depending on the application. For example, for metering and demand response, dynamic ranges of about 0 to >2× the nominal current may be acceptable. When fault detection is required, a dynamic range similar to >10× the nominal current has to be measured in real time. For assessment of power quality, the measurement of the harmonics is critical, so higher bandwidths such as ~45-~6,000 Hz may be typically required. Smart grids deliver electricity from suppliers to consumers using digital technology to save energy, reduce cost, and increase reliability and transparency. Particularly with such smart grids, utilities and industrials will require that the same sensor be used for multiple purposes. Increasing the airgap of the magnetic concentrator may increase the saturation level but may also increase the sensitivity to adjacent fields.

Traditional sensors are typically separate for different applications. For example, current and voltage transformers are used for metering and demand response, while Rogowsky Coil or Hall effect devices are used for fault allocation and system protection. A fully fiber optic or bulk current sensor can naturally be used for all applications but is expensive and cannot be clamped to the cable.

Woods et al., U.S. Pat. No. 5,892,357, discloses an electro-optic voltage sensor for sensing voltage in an electric field, the sensor being based on Pockel's electro-optic effect. This requires a simple and contactless arrangement of the sensor with the cable.

Blake, U.S. Pat. No. 6,166,816, describes the use of one light source for a combined fiber optic current and voltage sensor. It is, however, difficult to make a clamp-on version of the current sensor disclosed. The electric utility can use it during a new set up or take apart the current carrying cable for installation.

Ishiko et al., U.S. Pat. No. 4,999,571, describes a clamp-on optical current and voltage sensor. The sensor is attached using a two part process that involves a linear slide and rotation. The voltage sensor is based on a capacitive divider that has no ground connection. The ground reference is created by the virtual capacitance between the sensor and the ground. This virtual capacitance changes with in the atmosphere (e.g., humidity, dust), mobile conductive masses such as motor vehicles, and electromagnetic interference from adjacent phases or other sources. Furthermore, the sensor relies upon a mechanical adjustment for accurate readings. The sensor must be attached to the line when the voltage to the line is off. The crystal used in the current sensor is a garnet crystal, which is temperature sensitive. The sensor also uses quarter wavelength plate for the voltage sensor, and this wave plate is also temperature sensitive.

Ykymyshyn et al., U.S. Pat. No. 7,279,870, discloses a method of measuring a current based on multiple Hall-effect based semiconductor sensors combined with electronics and compensated by a source with a reference AC voltage. This method requires installing a solid state electronics adjacent to the power cable and is therefore less reliable due to the exposure to the transients or the effects of lightning on the cable.

Bjorn, U.S. Pat. No. 7,068,025, teaches a simplified sensor based on the Faraday effect that relates a rotation of the plane of polarization in proportion to the intensity of the component of the magnetic field in the direction of the beam of light. Ampere's law relates the integrated magnetic field around a closed loop of a conductor to the electric current passing through the loop. The Bjorn patent teaches a method that samples only one point around the conductor.

This method is sensitive to the magnetic field of an adjacent phase or to the magnetic interferences with other sources. To compensate for those errors, software corrections are utilized, by comparing the readout to a reference current sensor that surrounds the conductor. This compensation method is not accurate when there are changes in the installation. Even common factors such as wind the passage of nearby cars can change the configuration of the measured magnetic field.

C. V Temple et al., U.S. Pat. No. 2,709,800, teaches a power line fault detector that allows mechanical adjustment of the airgap of a concentrator for detecting various levels of current. This sensor may only be used for the detection of fault currents. Temperature and vibrations can induce errors in the readings of this form of detector.

Attarian et al., U.S. Pat. No. 6,844,799, teaches a Hall effect current sensor that utilizes mixed magnetic materials to optimize the dynamic range of the current sensor in a circuit breaker. The device requires fixed dimensions which cannot be adapted to some airgaps, and is therefore constrained with regard to magnetic strips that may be used.

Bosselmann et al., U.S. Pat. No. 5,963,026, discloses two Faraday elements or crystals for two different measurement ranges in order to achieve a higher dynamic range. This adds to the complexity and the cost.

Bluzer, U.S. Pat. No. 4,590,505, discloses a three dimensional optical receiver having programmable gain control. The gain is optimized in a logarithmic way which is not suitable to optical current and voltage sensors, which must be linear in order to maintain the accuracy of the harmonics.

The prior art teaches various devices and methods for measuring the current and the voltage in real time in a current carrying cable using optical sensors. However, the prior art does not teach a low cost and simple sensor design for accurate measurements at large dynamic range, sensitivity and bandwidth, that is capable of being installed on the cable without disturbing the function of the cable. The present invention fulfills these needs and provides further related advantages as described in the following summary.

SUMMARY OF THE INVENTION

The present invention teaches certain benefits in construction and use which give rise to the objectives described below.

The present invention provides a method of measuring a current of a current carrying cable. The method comprises steps of providing an optical sensor assembly comprising a base unit, and an optical current sensor mounted on the base unit for transmitting a beam of polarized electromagnetic radiation to an optical fiber. A light detector is also provided having a first channel that operably connects the light detector to an analog to digital converter through a programmable gain amplifier, a second channel that operably connects the light detector directly to the analog to digital converter, and a processor operably connected to the analog to digital converter. The optical sensor assembly is mounted adjacent the current carrying cable, and is operably connected to a light detector. A plurality of factors are then evaluated from rotation information from the light detector, by using the first and second channels for analog to digital conversion operably connected with the processor.

A primary objective of the present invention is to provide a method for sensing current having advantages not taught by the prior art.

Another objective is to provide a method for sensing current on a current carrying cable without having to cut or otherwise disrupt the function of the cable.

A further objective is to provide method for sensing current that enables an improved dynamic range and sensitivity of measurement for an optical current sensor, by using the magnetic concentrator with a distributed-airgap.

A further objective is to provide a method for sensing current that includes control elements operably connected to the sensor only with optical fibers, and is properly grounded, so that there is reduced danger of high voltage transfer to the control elements.

A further objective is to provide a method for sensing current that enables several instruments to be operably connected to a current sensor for measuring several qualities of the current simultaneously.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings:

FIG. 3 is a side elevation view of FIG. 1;

FIG. 4 is a side elevation view of FIG. 2;

FIG. 5 is a side elevation view of the magnetic concentrator as in FIGS. 2 and 4, in relation to the cable and the current sensor, the magnetic concentrator further illustrating the distributed-airgap in the concentrator, according to an embodiment of the invention.

FIG. 6A is a side elevation view of the magnetic concentrator as in FIGS. 1 to 4, illustrating the distributed-airgap in the concentrator, with laminations of a magnetic material in a medium of non-magnetic material, according to an embodiment of the invention;

FIG. 6B is a cross-sectional view thereof, taken along line 6B-6B in FIG. 6A;

FIG. 7 is a side elevation view of the interior of the assembly along with the optical voltage sensor;

DETAILED DESCRIPTION OF THE INVENTION

The above-described drawing figures illustrate the invention, an optical sensor assembly 10 for installation on a current carrying cable 12, particularly of a high voltage electricity distribution system, for measuring the current and voltage of the current carrying cable 12.

Figure 1:
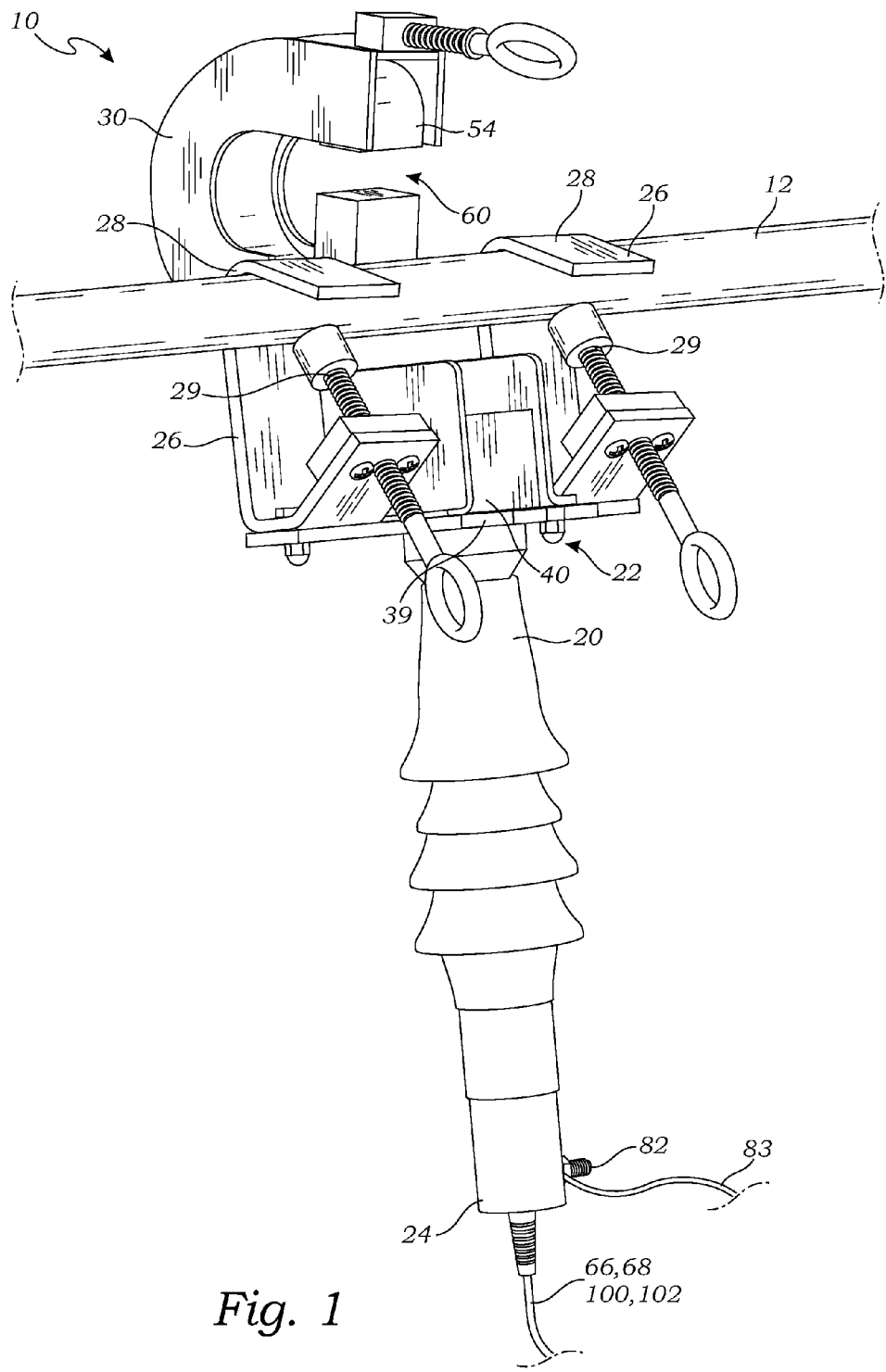
FIG. 1 is a perspective view of an optical sensor assembly when the magnetic concentrator is in open position, according to one embodiment of the present invention.
Figure 2:
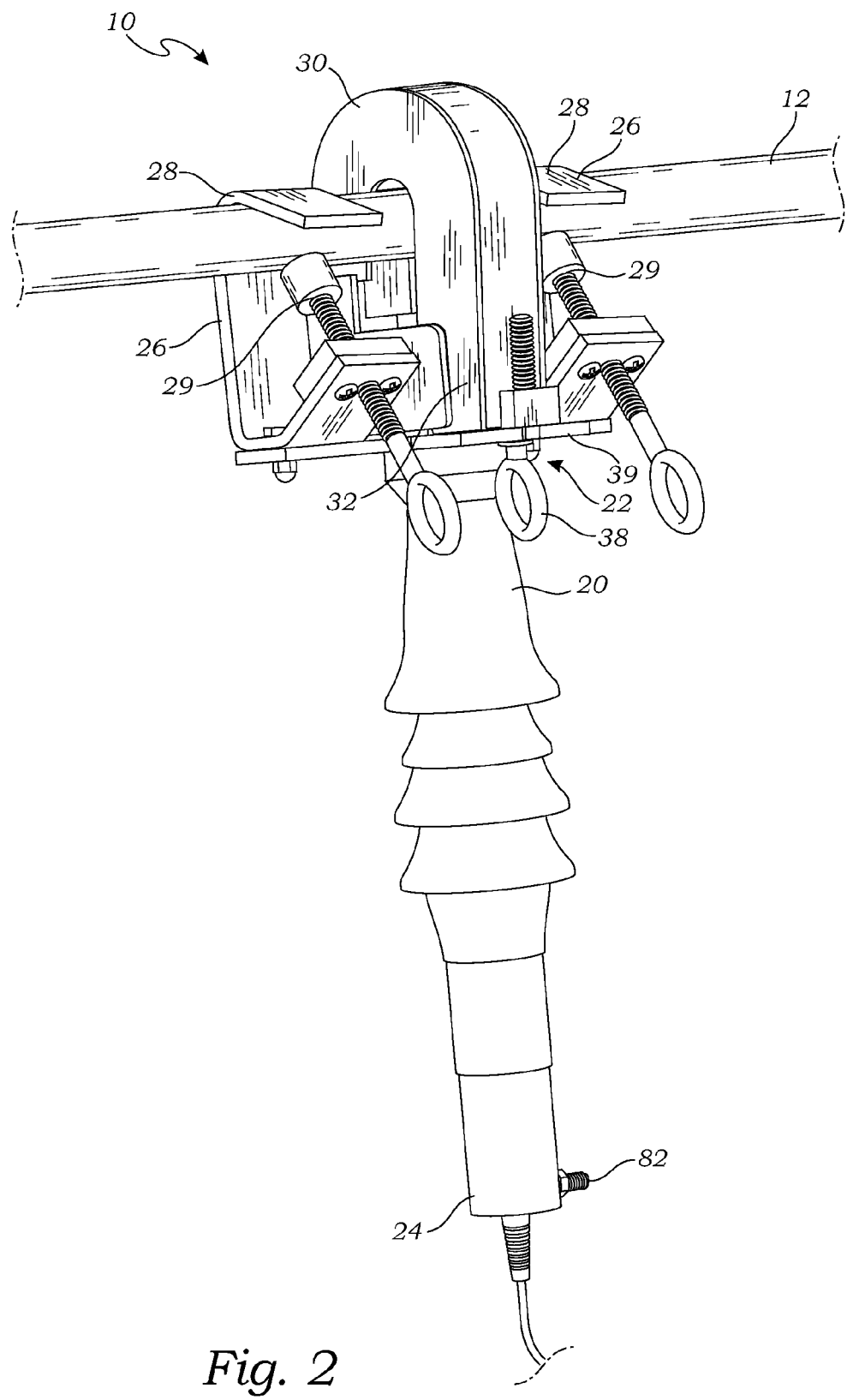
FIG. 2 is a perspective view of FIG. 1 when the magnetic concentrator is in closed position.

FIG. 1 is a perspective view of one embodiment of the optical sensor assembly 10 when a magnetic concentrator 54 is in the open position. FIG. 2 is the same perspective view illustrating the magnetic concentrator 54 in the closed position. FIGS. 3 and 4 represent their side elevation views respectively.

In the embodiment of FIGS. 1-4, the optical sensor assembly 10 comprises a base unit 20 having a top end 22 and a bottom end 24. In this embodiment, the base unit 20 is an elongate structure having an optical current sensor 40 mounted in the top end 22 and a voltage sensor 70 mounted near the bottom end 24. While this arrangement is advantageous in the present embodiment, those skilled in the art may devise alternative arrangements that should be considered within the scope of the present invention.

The base unit 20 includes at least one hook 26 for hanging the base unit 20 from the current carrying cable 12. In the embodiment of FIGS. 1-4, the at least one hook 26 includes a pair of hooks, one on either side of a light directing device 44, FIG. 5, of the optical current sensor 40, as discussed in greater detail below. Each of the hooks 26 may include a curved portion 28 adapted to hold the base unit 20 at its most effective distance D in concentrating the magnetic field from the current carrying cable 12. Each hook 26 may further include a clamping element 29, such as a screw clamp as illustrated, although other clamps and equivalent fasteners may be used, and the term clamping element 29 is expressly defined to include such alternative constructions. The clamping element 29 clamps the current carrying cable 12 against the curved portion 28 of the hook 26 to secure the base unit 20 in place on the current carrying cable 12, so that the assembly remains physically stable relative to the cable even in rough weather conditions.

A concentrator housing 30 is attached to the top end 22 of the base unit 20 for securing the magnetic concentrator 54 around the current carrying cable 12. The concentrator housing 30 has a first end 32 and a second end 34. A pivot 36 of the second end 34 of the concentrator housing 30 pivotally attaches the concentrator housing 30 with the top end 22 of the base unit 20 such that the concentrator housing 30 moves between an open position and a closed position. The term pivot 36 is hereby defined to include any movable connection that enables the concentrator housing 30 to move in a manner that properly positions the magnetic concentrator 54 around the current carrying cable 12, as described herein, and includes any alternative or equivalent constructions known to those skilled in the art.

In the open position, the concentrator housing 30 is moved away from the base unit 20. In the closed position, the concentrator housing 30 positions the magnetic concentrator 54 around the current carrying cable 12 such that the current carrying cable 12 passes through the magnetic concentrator 54 without physically touching the magnetic concentrator 54 or the concentrator housing 30.

A locking element 38 is provided for removably securing the first end 32 of the concentrator housing 30 to the base unit 20 in the closed position. In the present embodiment, the locking element 38 is a screw-type clamp attached to the concentrator housing 30 that removably engages a flange 39 of the base unit 20. The locking element 38 locks the concentrator housing 30 in the closed position, thereby maintaining the magnetic concentrator 54 in its proper position relative to the current carrying cable 12, as described in greater detail below.

FIG. 5 is a side elevation view of the magnetic concentrator 54 of FIGS. 2 and 4, in relation to the current carrying cable 12 and the optical current sensor 40. As illustrated in FIG. 5, the optical current sensor 40 comprises a polarized light input 42, a light directing device 44 (e.g., reflective prism, mirror(s), etc.), and a light output 46. The polarized light input 42 is operably connected with a polarized light source 48, and the light output 46 is operably connected to a light detector 50. The polarized light source 48 is configured for transmitting a beam of polarized electromagnetic radiation 52 via the polarized light input 42 into the reflective prism 44, where it is reflected out the light output 46, and to the light detector 50 for analysis.

As illustrated in FIG. 5, the magnetic concentrator 54 has a first end 56 and a second end 58 that together define an airgap 60 therebetween. The magnetic concentrator 54 is mounted on the concentrator housing 30 such that the magnetic concentrator 54 fits around the current carrying cable 12 when the base unit 20 is hung from the current carrying cable 12 by the at least one hook 26 and when the concentrator housing 30 is moved to the closed position. In this position, the reflective prism 44 of the base unit 20 is operably positioned in the airgap 60 of the magnetic concentrator 54 when the concentrator housing 30 is in the closed position.

The optical current sensor 40 is mounted on the base unit 20 such that it is positioned in the airgap 60 is used for sensing the current in the cable, where, as shown in FIG. 5, the current sensor 40 is provided within the base unit 20 and accommodated with a relief, that is, a slight clearance, in the airgap 60 when in the closed position. The light input 42 is configured for transmitting the beam of polarized electromagnetic radiation 52 to the light output 46. The beam is transmitted through the light directing device 44 to exit from the light output 46 so it may be received by the light detector 50. A magnetic field created by the current, per Ampere's law, is concentrated by the magnetic concentrator 54 into the airgap 60. The plane of polarization of the beam is rotated by the magnetic field in the airgap 60, the rotation being proportional to the strength of the magnetic field in the airgap 60 (Faraday effect). The light detector 50 measures this rotation for representing a current level and a current direction in the cable. The path of the beam within the current sensor 40 is aligned substantially, but preferably precisely, with the lines of the magnetic field. For clarity and convenience, the term "light" is used herein. However, as used by those skilled in the electro-optic art, it is intended to include "electromagnetic radiation" outside (above and below) of the visible spectrum. For example, most commonly, infrared frequencies are understood to be included within the meaning of the term "light".

The light directing device 44 may be, in one embodiment, a reflective prism. The reflective prism 44 may be any shape that directs the light from the light input 42 to the light output 46. In the present embodiment, the reflective prism 44 is a glass prism having a pair of sloped reflective surfaces 62 for directing the beam as described above. While prior art applications use garnets or other materials, glass provides benefits such as low temperature sensitivity. Other shapes of reflective prism 44, mirror, or fiber optic configuration may alternatively be used.

When an optical sensor based on the Faraday effect is used, the sensitivity of the sensor depends on the beam travel length along the magnetic field. For a selected width of the airgap 60, the current sensor 40 can be designed to a dimension that utilizes the maximum sensitivity so that the sensitivity lost due to the airgap 60 will be gained by the travel of the beam in the current sensor 40. The shape of the magnetic concentrator 54 and the size of the airgap 60 can be optimized to accommodate the largest size of the current sensor 40. The current sensor 40 is designed to maximize the length of the beam to increase sensitivity. The difference in the size of the airgap 60 and the current sensor 40 is used to allow housing with a relief. The assembly is configured to avoid using the ¼ wave plate as described in prior art articles. The ¼ wave plate requires more complex temperature compensation, and this is avoided using the present assembly 10.

The beam of polarized electromagnetic radiation 52 is preferably aligned substantially along the magnetic field in the airgap 60. The magnetic field in the airgap 60 rotates the plane of polarization of the beam 52 within the reflective prism 44. The rotation is proportional to the strength of the magnetic field in the airgap 60 and measurable by the light detector 50 for determining the current in the current carrying cable 12.

In the embodiment of FIG. 5, the magnetic concentrator 54 is D-shaped and includes a flattened portion 57, with the airgap 60 being positioned in an offset position at the edge of the flattened portion 57, so that the airgap 60 fits around the cable 12 during installation. In this embodiment, the magnetic concentrator 54 does not have to include any form of break or hinge to be installed. In the embodiment of FIG. 6A, the magnetic concentrator 54 may be C-shaped. While this allows the use of laminations and more standard components, it typically must further include a hinge 59 to facilitate installation. While two embodiments are disclosed, the magnetic concentrator 54 may include any similar or equivalent shape that functions to provide the necessary magnetic field to the airgap 60.

In the embodiment of FIGS. 5 and 7, the optical sensor assembly 10 includes a first optical fiber 66 for transmitting the output beam of rotationally shifted polarized electromagnetic radiation 52 from a polarized light source 48 to the polarized light input 42 of the reflective prism 44; and further includes a second optical fiber 68 for transmitting the beam of polarized electromagnetic radiation 52 from the light output 46 of the reflective prism 44 to the light detector 50. The first and second optical fibers 66 and 68 may extend to electronics components, controllers, and the like located either inside or outside of the base unit 20, as discussed in greater detail below.

In the embodiment of FIG. 5, the magnetic concentrator 54 comprises at least one type of soft magnetic powder mixed with at least one type of non-magnetic material for creating a distributed-airgap in the magnetic concentrator 54.

Alternatively, as illustrated in FIG. 6A, along with a cross-sectional view of the magnetic concentrator 54 in FIG. 6B, the magnetic concentrator 54 includes a plurality of laminations 64 of at least one type of magnetic material mixed with at least one type of non-magnetic material. The laminations 64 are arranged to create the airgap 60. These mixed magnetic materials function to optimize the dynamic range of the optical current sensor 40 and greatly increase the saturation level of the magnetic concentrator 54 while maintaining an acceptable level of sensitivity in low currents, with low influence of adjacent magnetic fields.

FIG. 7 is a sectional view of FIG. 4, illustrating various internal components of the optical sensor assembly 10. As shown in FIG. 7, the optical sensor assembly 10 may further include a voltage sensor 70 operably mounted on or within the base unit 20 for sensing the voltage of the current carrying cable 12. The voltage sensor 70 may be placed near the bottom end 24 of the base unit 20 so that the voltage sensor 70 is positioned in a stable electronic field which is protected from outside interference. Furthermore, as described in greater detail below, electronics components are located remotely from the high voltage cable, via fiber optics as described below, such that deteriorating effects of high voltage transients, lightning and other weathering conditions on the electronics parts can be reduced; however, these components may be placed elsewhere as determined by one skilled in the art.

In the embodiment of FIG. 7, the assembly 10 may include an electrically conductive tube 72 having a proximal end 74 and a distal end 76. The proximal end 74 may be electrically connected to the current carrying cable 12 (e.g., via the hooks 26, or other means) when the assembly is mounted on the at least one hook 26. In this embodiment, the assembly may further include a grounded surface 78 mounted proximate to the electrically conductive tube 72, separated by a gap 80 from the electrically conductive tube 72. The grounded surface 78 is maintained at a ground potential via a ground stud 82 adapted to be attached via a ground wire 83 to a grounded element, as is known in the art. The term "ground stud" is hereby defined to include any attachment point or feature otherwise adapted to be attached to a grounded element. While one embodiment is illustrated herein, those skilled in the art may devise alternative constructions that should also be considered within the scope of the present invention.

In this embodiment, the voltage sensor 70 is an optical voltage sensor operably positioned in the gap 80 between the electrically conductive tube 72 and the grounded surface 78.

In one embodiment, the optical voltage sensor 70 may include an input for a beam of polarized electromagnetic radiation having at least two components propagating along at least two orthogonal planes, within a sensor for sensing a rotational shift on the components as the beam travels within the sensor through the gap 80 between the electrically conductive tube 72 and the grounded surface 78. For example, the voltage sensor 70 may be an electro-optic voltage sensor including a transmitter, sensor, reflector, and detector. The transmitter may be configured to transmit a beam of polarized electromagnetic radiation having two components propagating along orthogonal planes. The sensor may be subjected to the portion of the field and configured to induce a rotational shift in the orthogonal beam components dependent upon the magnitude of the portion of the field. The reflector may receive the beam after passing through the sensor and direct the beam back through the sensor. The detector may detect the rotational shift of the orthogonal beam components and produce the signal dependent upon the rotational shift. A suitable electro-optic voltage sensor is disclosed in U.S. Pat. No. 5,892,357 issued to Woods et al., the contents of which are hereby incorporated by reference in full. See also U.S. Pat. No. 7,199,571, which is also hereby incorporated by reference in full.

Also illustrated in FIG. 7, the first and second optical fibers 66 and 68 of the optical current sensor 40 may be positioned through the electrically conductive tube 72 such that the electrically conductive tube 72 functions as a Faraday cage for protecting the first and second optical fibers 66 and 68.

There may be cases wherein the assembly 10 may be used for more than one application. For example, the assembly 10 may simultaneously be used for fault allocation together with regulating the quality of power. In those cases more, than one channel of analog to digital conversion may be used. The analog to digital conversion can be done by more than one analog to digital converters or a multichannel analog to digital converter. This 'multi channel gain' approach can also be implemented by software instead of hardware.

The same improvement is used in the optical voltage sensor 70 to enable measurement of lower voltages and very high transients with the same design of optics and housing of the sensor. When properly designed, the dynamic range of the optical voltage sensor 70 is limited by the noise floor of the electronics and the power supplies. Multiple channels for analog to digital conversion or a multichannel analog to digital converter may be used.

The magnetic concentrator 54 is low in cost, it may be easily clamped onto existing cables 12 without cutting the cables 12, and provides a better dynamic range in comparison to prior art solutions. By properly selecting the magnetic concentrator 54 and adapting the electronics, the sensors can be used for multiple applications. For example, assuming a current sensor 40 capable of measuring 600 amperes, nominal, current and, also, capable of measurement of very high fault current (e.g., >5,000 amperes), the electronics must be fast, high in bandwidth, but lower in gain and accuracy. Currents less than 1 ampere may be measured at a lower bandwidth for several reasons. A normal harmonic content should be less than 5% and 5% of 1:600 ampere is negligible (0.000083 ampere) for metering and for quality of power. Therefore, a bandwidth of about 200 Hz is acceptable at this current. Current state of electronics allows dynamic adjustment of the gain and the bandwidth. The lower limit is the noise floor of the source of the beam(s) and of the electronics, and the higher limit is the saturation of the magnetic concentrator 54 and the power supply levels of the electronics.

Figure 8A:
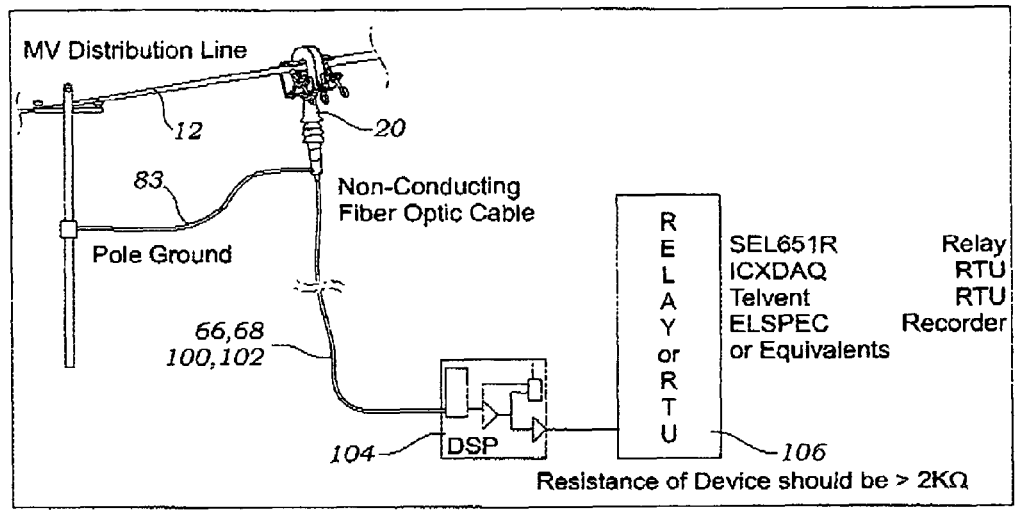
FIG. 8A is an illustration of the assembly according to a first embodiment of the invention, wherein the assembly is suspended from a current carrying cable of a high voltage electricity distribution system and connected to an electronics system for control and evaluation of the current and voltage levels in the cable.

FIG. 8A illustrates an arrangement for the assembly 10 according to an embodiment of the invention, wherein the base unit 20 is suspended from the cable 12 in a high voltage electricity distribution system, and is connected to an electronics system for control and evaluation of the current and voltage levels in the cable 12. The grounded element may be provided by a pole of the electricity distribution system, or any other suitable grounded structure or element. As illustrated, the first optical fiber 66 may be operably connected to an electronics circuit including electronics 104, such as a computing unit illustrated in FIG. 9, and which may include elements such as a digital signal processor DSP, the output of which may be fed to a relay unit 106.

Figure 8B:
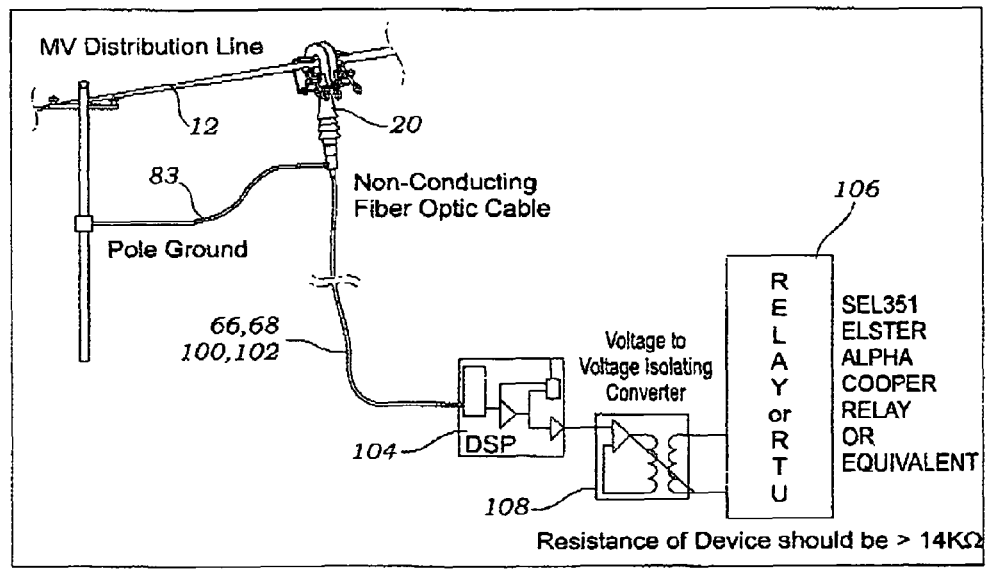
FIG. 8B is an illustration of a second embodiment thereof.
Figure 8C:
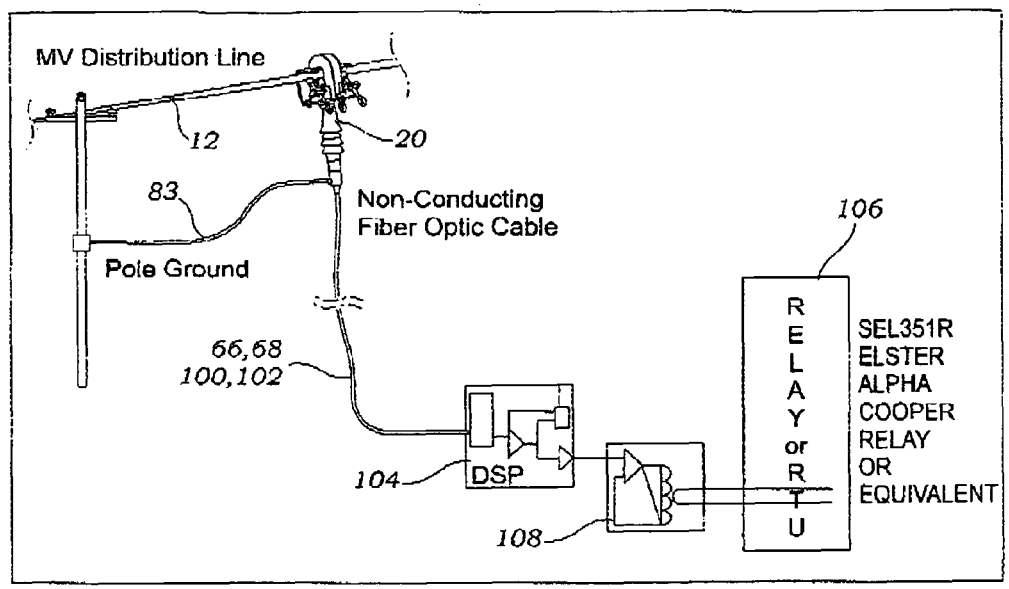
FIG. 8C is an illustration of a third embodiment thereof.
Figure 8D:
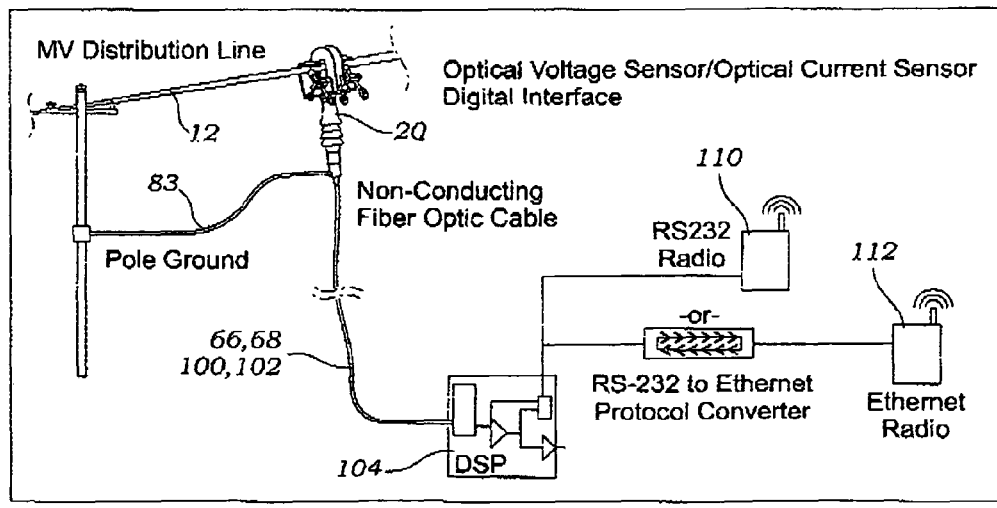
FIG. 8D is an illustration of a fourth embodiment thereof.

Other configurations are also possible, as illustrated in FIGS. 8B-8D. In the embodiment of FIG. 8B, the electronics 104 are connected to the relay unit 106 through a voltage isolating converter 108. In the embodiment of FIG. 8C, the use of an alternative relay is shown. In the embodiment of FIG. 8D, the electronics 104 are operably attached to wireless devices such as RS232 radio 110 and/or Ethernet radio 112.

Figure 9:
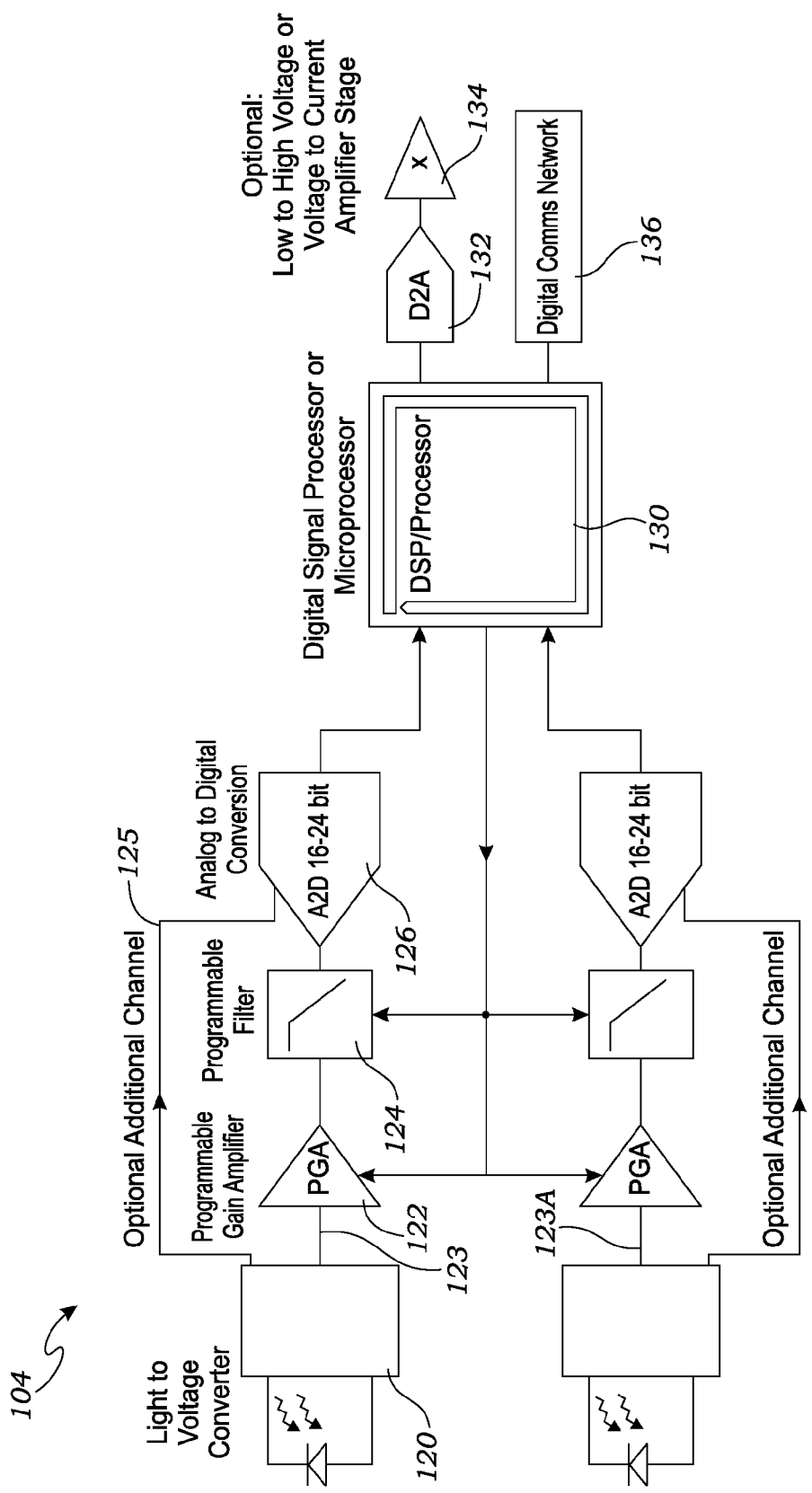
FIG. 9 is a schematic diagram of one embodiment of the electronics system of FIG. 8A.

FIG. 9 is one example of the electronics 104 of FIG. 8 wherein the beam of polarized electromagnetic radiation 52 (illustrated in FIG. 7) is directed (e.g., by optical fiber) to create current in a photodiode 120. The photodiode 120 may include multiple channels. The term "photodiode" is hereby defined to include similar light sensitive components such as a photo resistor or photo transistor. The light may be converted to voltage and connected directly or through other gain stages to a programmable gain amplifier (PGA) 122. The amplification channels may be divided to many channels in order to differentiate between the AC and DC component of the beam or to accommodate more than one sensor. In the present embodiment, the electronics 104 includes a first channel 123 and a second channel 125; however, further channels may also be included, according to the knowledge of those skilled in the art. As shown in FIG. 9, additional channels, such as 123A may be included.

The PGA 122 may be of a type that gets a computer command through computer bus discrete commands, such as by changing a resistor or voltage (as in Voltage Control Amplifier) or current command. This programming of the gain may be called Automatic Gain Control (AGC). The PGA 122 may include a low pass or a band pass filter or be connected to a separate filter 124. The filter 124 may include passive and/or active components. The filtered signal is directed to an analog to digital converter (ADC) 126 that will send the signal to the computing device 130, such as the DSP or a microprocessor or a computer. Some analog to digital converters 126 may have filters such as for oversampling and averaging, which may be used separately or in addition to the other filters. The computing device may determine the gain and the bandwidth required based on the signal level and the application, and will control the PGA 122, the filter 124, and ADC 126 accordingly. The ADC 126 may include a separate ADC for each channel 123 and 125, or may include a single multi-channel ADC.

The optical sensor(s) can be interfaced through analog or digital outputs. In one embodiment, the analog output can be a low energy output. For example, a ratio of 10,000:1 may be used for voltage, in this case 7200 volts on the cable 12 will be represented by 0.71 volts. Other ratios can be provided per customer request. A current may also be represented by a voltage. For example, 500 ampere may be represented by 1 volt. This low energy analog interface will be generally connected to a Remote Terminal Unit (RTU), an Intelligent Electronic Device (IED), a Programmable Logic Controller (PLC), a Supervisory Control and Data Acquisition System (SCADA), or a Relay 106, to send the information to a control system.

When legacy equipment is interfaced with the sensors, such as revenue meters or old relays, power amplifiers may be added (to mimic instrument transformers) to the analog output. A typical voltage to a meter in the United States is 120 volts, so a ratio of 60:1 will provide 120 volts when the cable 12 has 7200 volts. Other voltages up to 1,000 volts are available. A voltage to current amplifier may be connected to the analog output; for example, a 600:5 ampere ratio is typical in the United States.

For more modern smart grid applications, the digital output may be used. The most common are the RS-232 and/or the Ethernet. The computing unit 130 may be programmed to utilize the standard protocol in the customer region.

Those skilled in the art will recognize that more than one output per sensor may be used, with different scaling, to enable different instruments to be operably connected to the system, or a single instrument may be connected with multiple inputs. For example, metering, quality of power, and fault allocation monitors may simultaneously operate from the same output.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. A method of measuring current in a current carrying cable having a normal distribution level of current, the method comprising the steps of:

providing an optical sensor assembly comprising:
a base unit; and
an optical current sensor mounted with respect to said base unit said optical current sensor capable of receiving a polarized light input, and capable of transmitting said polarized light therethrough in a reflective manner, and capable of exposing said transmitted reflected polarized light to a magnetic field and provide a rotated, polarized light output after exposure to said magnetic field, due to the Faraday effect, said rotated, polarized light output being representative of the current creating said magnetic field;

providing a source of polarized light, said source connected to provide polarized light input to said optical current sensor;

providing a magnetic concentrator, having a high current saturation level substantially above said normal current level in said cable, wherein said magnetic concentrator is adapted to be disposed in close proximity to said current carrying cable and create said magnetic field representing the current in said cable;

providing an airgap across which said magnetic field extends;

hanging the optical sensor assembly downwardly from the current carrying cable;

providing means for placing said optical current sensor in said magnetic field within said airgap whereby is provided said output of rotated, polarized light; and providing light detector means for receiving said rotated polarized light and converting it to analog electrical signals representative of the current in said cable, without cutting said cable or otherwise disrupting any function of said cable.

2. The method of claim 1, further comprising the steps of:
providing analog to digital converter means for converting said analog electrical signals to digital signals, thereby providing an output of digital data signals;
providing a processor;
applying said rotated, polarized light output from said optical sensor to said light detector means, thereby converting said rotated, polarized light into analog electrical signals representing said current in said cable;
applying said analog electrical signals to said analog to digital converter means, thereby providing an output of digital data signals representing current in said cable;
applying said output of digital data signals representing current in said cable to said processor; and
evaluating in said processor one or more of a plurality of factors, including fault detection, fault allocation and quality of power.

3. The method of claim 1, further comprising the steps of;
providing an optical voltage sensor operably positioned within the electric field of said cable and sufficiently far away from said magnetic field to be unaffected thereby;
wherein said voltage in said cable has a nominal voltage value which the cable normally carries;
wherein said optical voltage sensor provides an output of analog electrical signals representing the voltages in said cable;
providing a processor for processing said analog electrical signals;
wherein said processor has the capability of handling a wide dynamic range of electrical signals, from approximately the noise floor of said optical voltage sensor to a voltage substantially greater than said nominal voltage; and
evaluating in said processor, one or more of said wide dynamic range of voltages, harmonics and transients in said electrical signals from one or both of said optical voltage sensor and said optical current sensor.

4. The method of claim 1, wherein said magnetic concentrator has an open and a closed position; and
wherein said hanging the optical sensor assembly downwardly from the current carrying cable comprises providing means for fixedly attaching said cable with respect to said base unit, irrespective of the position of said magnetic concentrator.

5. A method of measuring current in a current carrying cable, the method comprising the steps of:
providing a magnetic concentrator having an airgap and disposed in proximity to said current carrying cable and thereby creating a magnetic field, which extends through said airgap, representative of the current in said cable;
providing an optical current sensor adapted to be disposed within said magnetic field in said airgap and adapted to transmit a rotated, polarized light therethrough, expose said polarized light to said magnetic field which causes rotation of the polarization of said polarized light in accordance with said magnetic field representative of current in said cable; and thereby provide an output of rotated, polarized light representing the current flowing in said cable;
providing polarized light, which polarized light is transmitted through said optical current sensor to the output and which polarized light, when within said optical current sensor, is rotated by said magnetic field, which rotation represents current flowing in said cable;
providing light detector means for converting said rotated, polarized light output into analog electrical signals representing current flowing in said cable;
providing a plurality of analog to digital converters, disposed to receive said analog electrical signals and convert them to digital format; and
providing a processor disposed to receive said signals in digital format and adapted to measure and evaluate them as to, one or more of a plurality of factors, pertaining to said current, including, but not limited to, current level, fault detection, fault allocation and quality of power, in said current carrying cable.

6. The method of claim 5, further comprising the steps of:
providing an optical voltage sensor for sensing voltages in a cable having a nominal voltage level;
suitably positioning said optical voltage sensor within the voltage field of said current carrying cable so as to provide output information representative of the voltage in said cable;
wherein is included second light detector means and second channels of analog to digital conversion connected to provide output electrical signals in digital format, representing the voltage in said cable;
wherein said processor receives said digital format output information representative of the voltage in said cable; and
evaluating in said processor said voltages, from substantially lower than said normal voltage to very high transient voltages from two times to several times or more than several times said normal voltage.

7. The method claim 6, wherein said optical voltage sensor is suitably positioned in the electrical field of said cable by providing a conductive tube located at a substantial distance from said optical current sensor, within said optical sensor assembly, the method further comprising the steps of;
electrically connecting the conductive tube with the current carrying cable;
providing a ground voltage connection in proximity to said electrically conductive tube, whereby an electric field is created by the voltage between the interior of said conductive tube and said ground voltage connection;
positioning said optical voltage sensor with respect to the conductive tube, and, also, connecting it to said ground connection, whereby said optical voltage sensor is in the electric field of said cable and provides said output information representative of the voltage in said cable.

8. The method of claim 6, further comprising the steps of;
wherein the electronics of the system has a noise floor; and
wherein said evaluating in said processor evaluates said voltages from approximately said noise floor, upward.

9. A method of measuring current in a current carrying cable, having a normal level of current, the method comprising the steps of:
providing magnetic means for creating a magnetic field from the current flowing in said cable, such magnetic means adapted to create a magnetic field representing current flowing in said cable up to current levels several times or more than several times the normal level of current;
providing an optical current sensor having polarized light traveling therethrough and adapted to be operably disposed within said magnetic field and adapted to provide an output beam of rotated, polarized light representing the current up to current levels several times or more than several times said normal current level in said cable;

providing a beam splitter, splitting said output beam of rotated, polarized light into two polarized light components;
providing first and second light detectors, each operably connected to receive one of said two polarized light components and provide an output of analog electrical signals representing said light components;
providing first and second analog to digital converters;
providing two programmable gain amplifiers;
a first channel operably connecting the output of the first light detector to the first analog to digital converter through one of said programmable gain amplifiers; and wherein said output may also be directly connected to the first analog to digital converter;
a second channel operably connecting the output of the second light detector to the second analog to digital converter through the other of said programmable gain amplifiers and wherein said output may also be directly connected to the second analog to digital converter;
providing a processor operably connected to receive the outputs from said analog to digital converters and operably connected to control the gain of said programmable gain amplifiers; and
the step of measuring and evaluating, in said processor, one or more of a plurality of factors, comprising current level, harmonic content, transient occurrence, fault indication, fault allocation, and power factor.

10. The method of claim 9, further comprising the step of adjusting the gain and bandwidth of the programmable gain amplifiers dynamically,
wherein for the adjustment, a lower limit is determined by a noise floor in the corresponding signal, and a higher limit is determined by at least one factor including a saturation level of the magnetic concentrator and the power supply level in the corresponding light detector.

11. The method of claim 10, further comprising the step of:
sampling an electronic signal automatically before adjusting the gain and the bandwidth, when evaluating a feature including fault allocation and/or quality of power.

12. The method of claim 10, further comprising the step of:
sampling an electronic signal automatically before adjusting the gain and the bandwidth when evaluating a feature including low voltages and/or very high transients.

13. The method of claim 9, further comprising the step of:
evaluating said plurality of factors in said processor, substantially simultaneously.

14. The method of claim 9, further comprising the steps of:
providing an optical voltage sensor operably positioned within the electric field of said cable and sufficiently far away from said magnetic field to be unaffected thereby;
wherein said voltage in said cable has a nominal voltage value which the cable normally carries;
wherein said optical voltage sensor provides an output of electrical signals representing the voltage in said cable;
providing a processor for processing said electrical signals;
wherein said processor has the capability of handling a wide dynamic range of electrical signals, from approximately the noise floor of said optical voltage sensor to a voltage substantially greater than said nominal voltage; and
evaluating in said processor, one or more of said wide dynamic range of voltages, harmonics and transients in said electrical signals from said optical voltage sensor.

15. The method of claim 9, further comprising the step of;
providing an optical current sensor having more than one range of operation, thereby providing information having one or more different scales; and
wherein is included means for scaling the signal from said optical current sensor in accordance with its current range of operation.

16. A method of measuring current in a current carrying cable the method comprising the steps of:
providing an optical sensor assembly comprising:
a base unit;
an optical current sensor mounted on the base unit for transmitting a beam of polarized light to an optical fiber;
providing a light detector, a first channel operably connecting the light detector to an analog to digital converter through a programmable gain amplifier; a second channel that operably connects the light detector directly to the analog to digital converter, and a processor operably connected to the analog to digital converter;
mounting the optical sensor assembly adjacent the current carrying cable;
operably connecting the optical fiber to the light detector;
measuring and evaluating, in said processor, a plurality of factors from the rotation information from the light detector, by using the first and second channels for analog to digital conversion operably connected with the processor;
wherein the step of measuring and evaluating the plurality of factors includes evaluating fault allocation and quality of power;
providing a magnetic concentrator within said optical sensor assembly adjacent the current carrying cable, having an airgap having therein a magnetic field representing current in said cable;
providing a reflective prism within said optical current sensor, said reflective prism transmitting said polarized light in said optical current sensor;
positioning the reflective prism in the airgap of the magnetic concentrator; and
transmitting the beam of polarized light through the reflective prism and to the light detector.

17. The method of measuring and sensing current in a current carrying cable, having a normal level of current, and, at times, a wide range of currents up to several times or more than several times said normal level, the method comprising the steps of:
providing a magnetic concentrator creating a magnetic field from said currents flowing in said cable, said magnetic field having various intensities that range from low to high by reason of the magnetic concentrator having a high current saturation level up to several times or more than several times said normal level of current and a sensitivity to currents down to the noise floor of said polarized light;
placing a reflective optical current sensor within said magnetic field, said optical current sensor capable of transmitting polarized light, having a noise floor, therethrough to an output and being susceptible to the Faraday effect when within a magnetic field;
providing an input of polarized light, having a noise floor, to said optical current sensor;
whereby said optical current sensor provides an output of rotated, polarized light, from the Faraday effect of said magnetic field, said output of rotated, polarized light measuring and indicating the current in said cable from small fractions of an ampere to currents several times or more than several times said normal current level.

18. The method of claim 17, further including the step of: converting said output of rotated, polarized light into electrical signals representing current in said cable.

19. The method of claim 18 further including the steps of: processing said electrical signals in a processor controlling the gain and bandwidth of said electrical signals, thereby measuring and sensing one or more of a plurality of factors, comprising current level, harmonic content, transient occurrence, fault indication, fault allocation, and power factor.

20. The method of claim 19, wherein said processing includes determining current up to about ten times normal distribution current.

21. The method of claim 18 further including the steps of: processing selected frequencies of said electrical signals in order to measure and sense harmonic current content of said electrical signals to one of (a) down to $\frac{1}{600}$ of an ampere or (b) down to substantially less than $\frac{1}{600}$ of an ampere.

22. The method of claim 21, wherein said processing of selected frequencies include frequencies having a bandwidth on the order of about 6000 Hz.

23. A method of measuring current in a current carrying cable having a normal range of current levels and alternating at a distribution frequency, the method comprising the steps of:
providing an optical current sensor assembly;
providing a base unit for fixedly attaching said assembly to said cable and for mounting the various parts of said assembly;
providing means providing a magnetic field indicating the current flowing in said cable;
providing an optical current sensor, sensitive to the Faraday effect, mounted with respect to said base unit and capable of receiving a beam of polarized light input, transmitting said beam of polarized light therethrough in a reflective manner to an output and disposed to expose said transmitted, polarized light to the magnetic field caused by said current flowing in said cable, thereby causing a rotation of the polarization of said polarized light which is then provided at the sensor's output, thus, indicating currents flowing in said cable;
wherein said optical current sensor is capable of sensing one or more of
(a) currents up to several times or more than several times said normal range of current levels and
(b) currents of frequency several times or more than several times higher than said distribution frequency;
providing means providing a beam of polarized light to the optical current sensor;
providing light detector means for receiving the sensor's output and for determining the rotation of said polarized light and providing an analog electrical output which is a measurement of one or more factors, including, but not limited to, said current levels and current frequencies, in addition to said distribution frequency.

24. The method of claim 23 further comprising the steps of: providing an optical voltage sensor operably positioned within the electric field of said cable; and sufficiently remote from said magnetic field to be unaffected thereby;
wherein said cable has a nominal voltage value which the cable normally carries and wherein said cable often carries spurious harmonic and transient currents;
wherein said optical voltage sensor provides an output of analog polarized light signals representing the voltage and said harmonic and transient currents in said cable;
providing light detector means for converting said analog polarized light signals into analog electrical signals representing voltage;
providing a processor for processing said analog electrical signals representing voltage;
wherein said processor has the capability of handling a wide dynamic range of electrical signals, from approximately the noise floor of the electrical signals from said optical voltage sensor to a voltage several times or more than several times greater than said nominal voltage; and
wherein said processor measures and evaluates, one or more of said wide dynamic range of voltages, harmonics and transients.

25. The method of claim 23, wherein said light detector means is comprised of a beam splitter, splitting said output of polarized light into two polarized light components and further comprising the following steps:
wherein said light detector means also comprises first and second light detectors, each operably connected to receive one of said two polarized light components and provide an output of electrical analog signals representing said light components;
providing first and second analog to digital converters, wherein each of said digital converters has the capability of handling one or more digitizing channels therethrough;
providing two or more programmable gain amplifiers;
providing two programmable filters each connected to receive the output of one of said programmable gain amplifiers;
providing a first electrical analog signal channel operably connecting the output of said first light detector to said first analog to digital converter through one of said programmable gain amplifiers and its respective programmable filter;
providing said output of said first light detector directly to said first digital converter;
providing a second electrical analog signal channel operably connecting the output of said second light detector to said second analog to digital converter through another of said programmable gain amplifiers and its respective programmable filter;
providing said output of said second light detector directly to said second analog to digital converter;
providing a processor operably connected to receive the output from said analog to digital converters and control the gain of said two or more programmable amplifiers and controlling said programmable filters, in accordance with the data desired to be obtained; and
the step of measuring and evaluating in said processor, one or more of a plurality of factors, comprised of current level, harmonic content, transient occurrence, fault indication, fault allocation and power factor.

26. The method of claim 25 wherein is further included the steps of:
providing said means for providing the magnetic field with an airgap and, further, said means for providing the magnetic field having a saturation level two or more times as high as said normal range of current levels;
wherein said means for providing the magnetic field is movable close to said current carrying cable so as to create said magnetic field in said airgap, representative of currents in said current carrying cable;

wherein said base unit fixedly attaches said assembly to said cable independently of the position of said means for providing the magnetic field;

wherein, the reflective prism, in operable position, is in the airgap whereby said output beam of polarized light is rotated by said magnetic field in said airgap;

wherein each of said light detectors has a power supply energizing it; and wherein said processor controls said gain of said amplifiers by adjusting gain and bandwidth of said amplifiers dynamically by said processor;

wherein for the adjustment, a lower limit is determined by the noise floor in the corresponding signal, and a higher limit is determined by one or more factors, comprised of the saturation level of said means providing a magnetic field.

27. The method of claim 26 further comprising the steps of:

providing said processor with signal level information of said analog electronic signals in order to control the gain of said programmable gain amplifiers and is provided with predetermined information as to the frequencies and bands of frequencies to be passed by said filter means, and wherein the processor thereby measures and evaluates said one or more of said plurality of factors pertaining to said current at predetermined frequencies.

28. The method of claim 25 further comprising the steps of:

wherein said programmable filter means is adapted to control the frequencies and bands of frequencies passing from said programmable gain amplifiers into said processor through said analog to digital converters; and providing for said gain and said frequencies to be selectively controlled by said processor in accordance with the information desired to be evaluated.

29. The method of claim 23 wherein is further included the steps of:

providing said means for providing the magnetic field, indicating the current flowing in said cable, with the capability of having a saturation level two or more times as high as said normal range of current levels; and whereby the analog electrical output, of the light detector means, measures the current levels up to two or more times as high as said normal range of current.

\* \* \* \* \*